(12) United States Patent
Wang et al.

(10) Patent No.: US 12,413,197 B2
(45) Date of Patent: Sep. 9, 2025

(54) BAND-PASS FILTER CIRCUIT AND MULTIPLEXER

(71) Applicant: ANHUI ANUKI TECHNOLOGIES CO., LTD., Anhui (CN)

(72) Inventors: Xiaodong Wang, Anhui (CN); Chenggong He, Anhui (CN); Chengjie Zuo, Anhui (CN); Jun He, Anhui (CN)

(73) Assignee: ANHUI ANUKI TECHNOLOGIES CO., LTD., Anhui (CN)

( * ) Notice: Subject to any disclaimer, the term of this patent is extended or adjusted under 35 U.S.C. 154(b) by 0 days.

(21) Appl. No.: 18/257,274

(22) PCT Filed: Sep. 7, 2022

(86) PCT No.: PCT/CN2022/117518
§ 371 (c)(1),
(2) Date: Jun. 13, 2023

(87) PCT Pub. No.: WO2023/147724
PCT Pub. Date: Aug. 10, 2023

(65) Prior Publication Data
US 2024/0039501 A1 Feb. 1, 2024

(30) Foreign Application Priority Data
Feb. 7, 2022 (CN) .......................... 202210115860.4

(51) Int. Cl.
*H03H 7/00* (2006.01)
*H03H 7/01* (2006.01)
*H03H 9/58* (2006.01)

(52) U.S. Cl.
CPC ........ *H03H 7/0161* (2013.01); *H03H 7/0115* (2013.01); *H03H 9/581* (2013.01)

(58) Field of Classification Search
CPC ...... H03H 7/00; H03H 7/0153; H03H 7/0161; H03H 7/12; H03H 7/175; H03H 7/1783;
(Continued)

(56) References Cited

U.S. PATENT DOCUMENTS 11,929,725 B2 * 3/2024 He ..................... H03H 9/605
12,316,302 B2 * 5/2025 Hurwitz ............... H03H 9/6483
(Continued)

FOREIGN PATENT DOCUMENTS

CN 103208669 A 7/2013
CN 109672421 A 4/2019
(Continued)

OTHER PUBLICATIONS

Japanese Office Action received for JP Application No. 2023-537701 on Jun. 25, 2024, 6 pgs.
(Continued)

*Primary Examiner* — Hai L Nguyen
(74) *Attorney, Agent, or Firm* — Merchant & Gould P.C.

(57) ABSTRACT

Provided are a band-pass filter circuit and a multiplexer. The band-pass filter circuit includes an electromagnetic LC filter circuit and acoustic resonance units. At least one of the acoustic resonance units each includes at least one first acoustic resonator and at least one second acoustic resonator. The first acoustic resonator is connected in series between the band-pass filter circuit and the electromagnetic LC filter circuit. Each of the at least one second acoustic resonator is connected to a terminal of the at least one first acoustic resonator, where the first terminal of the band-pass filter circuit serves as an input terminal or output terminal of the band-pass filter circuit. One or more of the acoustic resonance units are connected on an input side of the electromagnetic LC filter circuit; and the remaining of the acoustic
(Continued)

resonance units are connected on an output side of the electromagnetic LC filter circuit.

20 Claims, 6 Drawing Sheets

(58) Field of Classification Search
CPC .......... H03H 9/54; H03H 9/542; H03H 9/581; H03H 9/62; H03H 9/64; H03H 9/205
USPC .......................... 333/167, 174; 327/552, 557
See application file for complete search history.

(56) References Cited

U.S. PATENT DOCUMENTS

| | | | |
|---|---|---|---|
| 2006/0139125 | A1 | 6/2006 | Shiga-ken |
| 2015/0070107 | A1 | 3/2015 | Tokuda |
| 2017/0093365 | A1 | 3/2017 | Xu |
| 2017/0126201 | A1 | 5/2017 | Iwamoto |
| 2019/0028085 | A1 | 1/2019 | Kato |
| 2019/0326883 | A1 | 10/2019 | Kim et al. |
| 2019/0356300 | A1 | 11/2019 | Knapp |
| 2020/0028479 | A1 | 1/2020 | Ta |
| 2022/0263485 | A1 | 8/2022 | He et al. |

FOREIGN PATENT DOCUMENTS

| | | | |
|---|---|---|---|
| CN | 109672422 | A | 4/2019 |
| CN | 111490749 | A | 8/2020 |
| CN | 211830724 | U | 10/2020 |
| CN | 113556095 | A | 10/2021 |
| CN | 114448382 | A | 5/2022 |
| CN | 216794959 | U | 6/2022 |
| GB | 2596914 | A | 1/2022 |
| JP | H0998046 | A | 4/1997 |
| JP | 2003243966 | A | 8/2003 |
| JP | 2019024155 | A | 2/2019 |
| JP | 2020014204 | A | 1/2020 |
| JP | 2021190908 | A | 12/2021 |
| KR | 2021-0141914 | A | 11/2021 |
| WO | 2005055423 | A1 | 7/2007 |
| WO | 2013180003 | A1 | 12/2013 |
| WO | 2015194581 | A1 | 4/2017 |
| WO | 2021227347 | A1 | 11/2021 |

OTHER PUBLICATIONS

Chinese Office Action received for CN Application No. 202210115860.4 on Mar. 31, 2023, 15 pgs.
International Search Report and Written Opinion received for PCT Serial No. PCT/CN2022/117518 on Dec. 2, 2022, 9 pgs.
European Search Report issued on Oct. 15, 2024 for corresponding EP Application No. 22902463.3 (11 pages).
First Office Action issued on Oct. 30, 2024 for corresponding Korean Application No. 10-2023-7020699 (13 pages including English Translation).

* cited by examiner

BAND-PASS FILTER CIRCUIT AND MULTIPLEXER

CROSS-REFERENCE TO RELATED APPLICATIONS

This application is a national stage of International Application No. PCT/CN2022/117518, filed on Sep. 7, 2022, which claims priority to Chinese Patent Application No. 202210115860.4, filed on Feb. 7, 2022, with the China National Intellectual Property Administration, both of which are incorporated herein by reference in their entirety.

FIELD

The present disclosure relates to the technical field of filtering, and in particular to a band-pass filter circuit and a multiplexer.

BACKGROUND

A filter circuit is widely applied in an integrated circuit. An example of such filter circuit is a multiplexer used in the integrated circuit. In modern communications, there is a growing demand for a filter circuit with wide passband and high suppression. Although an electromagnetic LC filter, a duplexer and a multiplexer according to a conventional technology can achieve a low insertion loss within a wide passband, it is difficult to realize a steep roll-off and strong suppression of a wide adjacent band. A method to enhance the suppression characteristic of the adjacent band is to increase a quantity of stages of the filter circuit, which results in an increased dimension of the device and an increased insertion loss.

SUMMARY

A band-pass filter circuit and a multiplexer are provided according to embodiments of the present disclosure, in order to improve a roll-off slope of the band-pass filter circuit, enhance a suppression characteristic of an adjacent band, and filter an interference signal.

A band-pass filter circuit is provided in the present disclosure. The band-pass filter circuit includes an electromagnetic LC filter circuit and acoustic resonance units. At least one acoustic resonance unit of the acoustic resonance units each includes at least one first acoustic resonator and at least one second acoustic resonator; the at least one first acoustic resonator is connected in series between a first terminal of the band-pass filter circuit and a first terminal of the electromagnetic LC filter circuit; each of the at least one second acoustic resonator is connected to a terminal of the at least one first acoustic resonator; where the first terminal of the band-pass filter circuit serves as an input terminal or output terminal of the band-pass filter circuit; one or more of the acoustic resonance units are connected on an input side of the electromagnetic LC filter circuit; and the remaining one or more of the acoustic resonance units are connected on an output side of the electromagnetic LC filter circuit.

In an embodiment, each acoustic resonance unit other than the at least one acoustic resonance unit includes only one acoustic resonator. One or more acoustic resonators included in an acoustic resonance unit other than the at least one acoustic resonator unit are all connected in series between a second terminal of the band-pass filter circuit and a second terminal of the electromagnetic LC filter circuit, or the one or more acoustic resonators included in an acoustic resonance unit other than the at least one acoustic resonator unit are connected in parallel between the second terminal of the band-pass filter circuit and the second terminal of the electromagnetic LC filter circuit. The second terminal of the band-pass filter circuit serves as an input terminal of the band-pass filter circuit, and the second terminal of the electromagnetic LC filter circuit serves as an input terminal of the electromagnetic LC filter circuit; or the second terminal of the band-pass filter circuit serves as an output terminal of the band-pass filter circuit, and the second terminal of the electromagnetic LC filter circuit serves as an output terminal of the electromagnetic LC filter circuit.

In an embodiment, the at least one acoustic resonance unit each includes a first port, a second port, and three acoustic resonators. The three acoustic resonators include two first acoustic resonators and one second acoustic resonator. The two first acoustic resonators are connected in series between the first port and the second port, the second acoustic resonator is connected to a terminal of the at least one first acoustic resonator; and the at least one acoustic resonance unit is connected in series between the first terminal of the band-pass filter circuit and the first terminal of the electromagnetic LC filter circuit. The first terminal of the band-pass filter circuit serves as an input terminal of the band-pass filter circuit, and the first terminal of the electromagnetic LC filter circuit serves as an input terminal of the electromagnetic LC filter circuit; or the first terminal of the band-pass filter circuit serves as an output terminal of the band-pass filter circuit, and the first terminal of the electromagnetic LC filter circuit serves as an output terminal of the electromagnetic LC filter circuit.

In an embodiment, the band-pass filter circuit further includes one or both of: at least one first circuit element, each of which includes a first terminal connected to the first port of one of the at least one acoustic resonance unit, and a second terminal connected to the second port of the acoustic resonance unit; and at least one first circuit element, connected in series between the first terminal of the band-pass filter circuit and the first terminal of the electromagnetic LC filter circuit.

In an embodiment, at least one acoustic resonance unit other than the at least one acoustic resonance unit each includes one first port, one second port, and at least three acoustic resonators. The at least three acoustic resonators include at least one first acoustic resonator and at least two second acoustic resonators. The at least one first acoustic resonator is connected in series between the first port and the second port, each of the at least two second acoustic resonators is connected to a terminal of the at least one first acoustic resonator. The at least one acoustic resonance unit is connected in series between the second terminal of the band-pass filter circuit and the second terminal of the electromagnetic LC filter circuit. The first terminal of the band-pass filter circuit serves as an output terminal of the band-pass filter circuit, the first terminal of the electromagnetic LC filter circuit serves as an output terminal of the electromagnetic LC filter circuit, the second terminal of the band-pass filter circuit serves as an input terminal of the band-pass filter circuit, and the second terminal of the electromagnetic LC filter circuit serves as an input terminal of the electromagnetic LC filter circuit; or the first terminal of the band-pass filter circuit serves as an input terminal of the band-pass filter circuit, the first terminal of the electromagnetic LC filter circuit serves as an input terminal of the electromagnetic LC filter circuit, the second terminal of the band-pass filter circuit serves as an output terminal of the band-pass filter circuit, and the second terminal of the electromagnetic LC filter circuit serves as an output terminal of the electromagnetic LC filter circuit.

In an embodiment, the at least one acoustic resonance unit other than the at least one acoustic resonance unit each further includes a second circuit element. The second circuit element is connected in parallel between the first port and the second port. The second circuit element includes an inductor or a capacitor.

In an embodiment, a quantity of acoustic resonance units connected between the second terminal of the band-pass filter circuit and the second terminal of the electromagnetic LC filter circuit is two or more, and adjacent ones of the acoustic resonance units share one of the at least two second acoustic resonators.

In an embodiment, the band-pass filter circuit further includes a substrate and one chip. The electromagnetic LC filter circuit includes at least one inductor and at least one capacitor. The chip is disposed on a side of the substrate. All acoustic resonators in the acoustic resonance units are disposed on the chip. The at least one capacitor is disposed on the chip. The at least one inductor is disposed in the substrate.

In an embodiment, the band-pass filter circuit further includes a substrate and at least two chips. The electromagnetic LC filter circuit includes at least one inductor or at least one capacitor. The at least two chips are disposed on a side of the substrate. All acoustic resonators in the acoustic resonance units are disposed on one of the at least two chips, and the at least one inductor or the at least one capacitor is disposed on another of the at least two chips.

In an embodiment, the band-pass filter circuit further includes a substrate and at least one chip. The electromagnetic LC filter circuit includes at least one inductor or at least one capacitor. The at least one chip is disposed on a side of the substrate. All acoustic resonators in the acoustic resonance units are disposed on the at least one chip. The at least one inductor or the at least one capacitor is disposed in the substrate.

In an embodiment, the band-pass filter circuit further includes an encapsulation layer, a conductive layer, and at least two chips. The electromagnetic LC filter circuit includes at least one inductor and at least one capacitor. The conductive layer is formed as at least one inductor and a connector. All acoustic resonators in the acoustic resonance units are disposed on one of the at least two chips. The at least one capacitor is disposed on another of the at least two chips. The encapsulation layer covers the at least two chips and the conductive layer, and exposes the connector.

A multiplexer is further provided according to the present disclosure. The multiplexer includes the band-pass filter circuit according to any of the above embodiments.

DETAILED DESCRIPTION OF EMBODIMENTS

Figure 1:
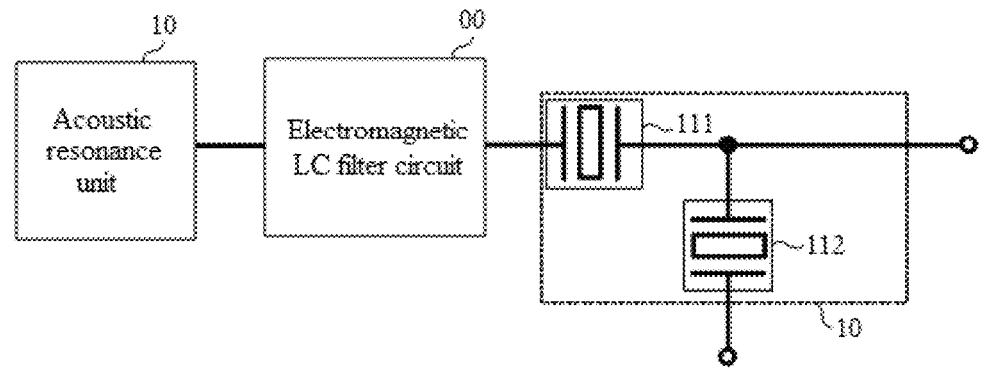
FIG. 1 is a schematic structural diagram of a band-pass filter circuit according to an embodiment of the present disclosure.

The present disclosure is illustrated below in conjunction with the drawings and embodiments. It should be understood that the specific embodiments described hereafter are only intended to explain the present disclosure, not to limit the present disclosure. It should be further noted that only parts related to the present disclosure, rather than all structures, are shown in the drawings, for ease of description.

A band-pass filter circuit is provided according to an embodiment of the present disclosure. FIG. 1 is a schematic structural diagram of a band-pass filter circuit according to an embodiment of the present disclosure. Reference is made to FIG. 1. The band-pass filter circuit includes an electromagnetic LC filter circuit 00 and at least two acoustic resonance units 10. At least one acoustic resonance unit 10 of the at least two acoustic resonance units 10 each includes at least one first acoustic resonator 111 and at least one second acoustic resonator 112. The first acoustic resonator 111 is connected in series between a first terminal of the band-pass filter circuit and a first terminal of the electromagnetic LC filter circuit 00. The second acoustic resonator 112 is connected to a terminal of the first acoustic resonator 111. The first terminal of the band-pass filter circuit serves as an input terminal or output terminal of the band-pass filter circuit. At least one of the acoustic resonance units 10 is connected on an input side of the electromagnetic LC filter circuit 00, and at least one of the acoustic resonance units 10 is connected on an output side of the electromagnetic LC filter circuit 00.

The electromagnetic LC filter circuit 00 may include an inductor and a capacitor. The electromagnetic LC filter circuit 00 may realize a passband under a specific configuration of the inductor and the capacitor. The electromagnetic LC filter circuit 00 may realize a wide passband. An input signal, when passes through the electromagnetic LC filter circuit 00, may be filtered by the electromagnetic LC filter circuit 00. In a case that at least one acoustic resonance unit 10 is connected on the input side of the electromagnetic LC filter circuit 00, at least one acoustic resonance unit 10 may be connected in series between an input terminal of the band-pass filter circuit and an input terminal of the electromagnetic LC filter circuit 00; and alternatively, the at least one acoustic resonance unit 10 may be connected in parallel between the input terminal of the band-pass filter circuit and the input terminal of the electromagnetic LC filter circuit 00. In a case that at least one acoustic resonance unit 10 is connected on the output side of the electromagnetic LC filter circuit 00, the at least one acoustic resonance unit 10 may be connected in series between an output terminal of the band-pass filter circuit and an output terminal of the electromagnetic LC filter circuit 00; and alternatively, the at least one acoustic resonance unit 10 may be connected in parallel between the output terminal of the band-pass filter circuit and the output terminal of the electromagnetic LC filter circuit 00.

The acoustic resonator in the acoustic resonance unit 10 has a high quality factor, and therefore the acoustic resonance unit 10 is of better frequency selectivity. In other words, the acoustic resonance unit 10 has a large roll-off slope in a frequency transition region between a passband and a stopband. That is, a transition between the passband and the stopband in the band-pass filter circuit has a high speed and a high efficiency. As there are the acoustic resonance unit 10 connected on the input side of the electromagnetic LC filter circuit 00 and the acoustic resonance unit 10 connected on the output side of the electromagnetic LC filter circuit 00, the acoustic resonance units may both contribute to increasing the roll-off slop on both sides of the passband of the electromagnetic LC filter circuit 00. Therefore, the band-pass filter circuit has both a wide pass-band and a steep roll-off slop, which improves a filtering effect of the band-pass filter circuit. The roll-off slope on both sides of the passband includes a roll-off slope between a minimum frequency within the passband and a left adjacent band of the passband (a frequency in the left adjacent band is less than a frequency in the passband), and a roll-off slope between a maximum frequency within the passband and a right adjacent band of the passband (a frequency in the right adjacent band is greater than a frequency in the passband). An adjacent band may refer to a frequency band above or below the passband, and a transition band between the adjacent band and the passband may be 0 MHz to tens of MHz. As an example, a bandwidth of the adjacent band indicates a frequency band ranges over 10% of a central frequency of the passband.

At least one acoustic resonance unit 10 each includes a first acoustic resonator 111 and a second acoustic resonator 112. In a case that the first terminal of the band-pass filter circuit serves as an input terminal of the band-pass filter circuit, the first resonator 111 is connected in series between the input terminal of the band-pass filter circuit and the input terminal of the electromagnetic LC filter circuit. In a case that the first terminal of the band-pass filter circuit serves as an output terminal of the band-pass filter circuit, the first acoustic resonator 111 is connected in series between the output terminal of the band-pass filter circuit and the output terminal of the electromagnetic LC filter circuit. Reference is made to FIG. 1. In an example, an acoustic resonator unit 10 includes a first acoustic resonator 111 and a second acoustic resonator 112. The first resonator 111 is connected in series between the output terminal of the band-pass filter circuit and the output terminal of the electromagnetic LC filter circuit. The second acoustic resonator 112 is connected to a terminal of the first resonator 111, so that the second acoustic resonator 112 serves as a branch between the input terminal of the band-pass filter circuit and the output terminal of the band-pass filter circuit. Hence, the first acoustic resonator 111 and the second acoustic resonator 112 can form a transmission zero within the adjacent band of the passband. Thereby, an effect of adjacent band suppression of the band-pass filter circuit is improved. Another terminal of the second acoustic resonator 112 is not connected to the first resonator 111, and may be connected to a ground or another circuit. A series resonant frequency of the second acoustic resonator 112 may be set out of the passband of the band-pass filter circuit, or a parallel resonant frequency of the second acoustic resonator 112 may be set within the passband of the band-pass filter circuit. Hence, a signal within the passband is prevented from being outputted from the second acoustic resonator 112 to another circuit or the ground, and thereby a signal loss in a band-pass filter circuit is reduced. In a case that the series resonant frequency of the second acoustic resonator 112 is out of the passband of the band-pass filter circuit, for example, the series resonant frequency of the second acoustic resonator 112 may be within the adjacent band, so that a noise signal within the adjacent frequency band may be outputted from the second acoustic resonator 112 to another circuit or the ground. Hence, the noise signal within the adjacent frequency band in the band-pass filter circuit is effectively suppressed, and thereby the filtering effect of the band-pass filter circuit is improved. A parallel resonant frequency of the first acoustic resonator 111 is within a stopband of the band-pass filter circuit, and the parallel resonance frequency of the second acoustic resonator 112 is within the passband of the band-pass filter circuit. Thereby, the roll-off slope on both sides of the passband is increased, and the filtering efficiency of the band-pass filter is improved.

In the technical solution of the embodiment of the present disclosure, both the input side and the output side of the electromagnetic LC filter circuit are provided with the acoustic resonant units. The acoustic resonator in the acoustic resonant units has a high quality factor. Therefore, the acoustic resonant units has a large roll-off slope in the frequency transition region, so that the roll-off slope on both sides of the passband of the band-pass filter circuit is increased. Hence, the band-pass filter circuit realizes a steep roll-off characteristic while maintaining a wide passband of the electromagnetic LC filter circuit. Furthermore, the acoustic resonator can form a transmission zero in the adjacent band, so that the suppression effect of the adjacent band is improved, and thereby the filtering effect of the band-pass filter circuit is improved.

In addition, FIG. 1 exemplarily shows that the band-pass filter circuit includes two acoustic resonance units 10. One of the acoustic resonance units 10 is connected, in series, to the input side of the electromagnetic LC filter circuit 00. The other one of the acoustic resonance units 10 is connected, in series, to the output side of the output terminal of the electromagnetic LC filter circuit 00. The band-pass filter circuit may include multiple acoustic resonance units 10. In a case that multiple acoustic resonance units 10 are connected on the input side of the electromagnetic LC filter circuit 00, the multiple acoustic resonance units 10 may be connected to each other in series, and then connected to the input terminal of the electromagnetic LC filter circuit 00. Alternatively, the multiple acoustic resonance units 10 may be connected to each other in parallel, and then connected to the input terminal of the electromagnetic LC filter circuit 00. In a case that multiple acoustic resonance units 10 are connected on the output side of the electromagnetic LC filter circuit 00, the multiple acoustic resonance units 10 may be connected to each other in series, and then connected to the output terminal of the electromagnetic LC filter circuit 00. Alternatively, the multiple acoustic resonance units 10 may be connected to each other in parallel, and then connected to the output terminal of the electromagnetic LC filter circuit 00.

Figure 2:
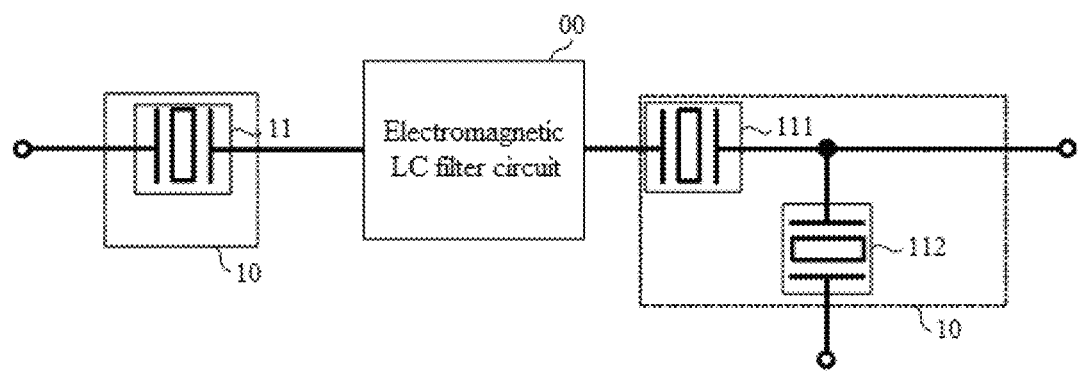
FIG. 2 is a schematic structural diagram of a band-pass filter circuit according to another embodiment of the present disclosure.

FIG. 2 is a schematic structural diagram of a band-pass filter circuit according to another embodiment of the present disclosure. Reference is made to FIG. 2. At least one acoustic resonance unit 10 each includes one acoustic resonator 11. The acoustic resonator 11 is connected in series between a second terminal of the band-pass filter circuit and a second terminal of the electromagnetic LC filter circuit 00. Alternatively, the acoustic resonator 11 is connected in parallel between the second terminal of the band-pass filter circuit and the second terminal of the electromagnetic LC filter circuit 00. A first terminal of the band-pass filter circuit serves as an input terminal of the band-pass filter circuit, and a first terminal of the electromagnetic LC filter circuit 00 serves as an input terminal of the electromagnetic LC filter circuit 00; and the second terminal of the band-pass filter circuit serves as an output terminal of the band-pass filter circuit, and the second terminal of the electromagnetic LC filter circuit 00 serves as an output terminal of the electromagnetic LC filter circuit 00. Alternatively, the first terminal of the band-pass filter circuit serves as the output terminal of the band-pass filter circuit, and the first terminal of the electromagnetic LC filter circuit 00 serves as the output terminal of the electromagnetic LC filter circuit 00; and the second terminal of the band-pass filter circuit serves as the input terminal of the band-pass filter circuit, and the second terminal of the electromagnetic LC filter circuit 00 serves as the input terminal of the electromagnetic LC filter circuit 00.

FIG. 2 exemplarily shows that there is one acoustic resonance unit 10 includes one acoustic resonator 11. The acoustic resonator 11 is connected in series between the second terminal of the band-pass filter circuit and the second terminal of the electromagnetic LC filter circuit 00. In this case, the second terminal of the band-pass filter circuit serves as the input terminal of the band-pass filter circuit, and the second terminal of the electromagnetic LC filter circuit 00 serves as the input terminal of the electromagnetic LC filter circuit 00. The acoustic resonator 11 is connected in series on the input side of the electromagnetic LC filter circuit 00, so that a transmission zero may be formed in a right adjacent band of the passband. Thereby, a roll-off slope between a maximum frequency in the passband of the electromagnetic LC filter circuit 00 and the right adjacent band (a frequency in the right adjacent band is greater than a frequency in the passband) is increased, an output amplitude of a noise signal within the right adjacent band is reduced, and a suppression effect of the adjacent band of the band-pass filter circuit is improved.

In an embodiment, the acoustic resonator 11 may be connected in series between the second terminal of the band-pass filter circuit and the second terminal of the electromagnetic LC filter circuit 00. Here, the second terminal of the band-pass filter circuit serves as the output terminal of the band-pass filter circuit, and the second terminal of the electromagnetic LC filter circuit 00 serves as the output terminal of the electromagnetic LC filter circuit 00. In this case, the roll-off slope of the passband of the electromagnetic LC filter circuit 00 is increased, and the suppression effect of the adjacent band of the band-pass filter circuit is improved.

In a further embodiment, there are multiple acoustic resonance units 10 each including one acoustic resonator 11. Some of the multiple acoustic resonance units 10 are connected on the input side of the electromagnetic LC filter circuit 00, and the other of the multiple acoustic resonance units 10 are connected on the output side of the electromagnetic LC filter circuit 00. The above-mentioned effects can also be achieved in this embodiment and are not repeated here.

Figure 3:
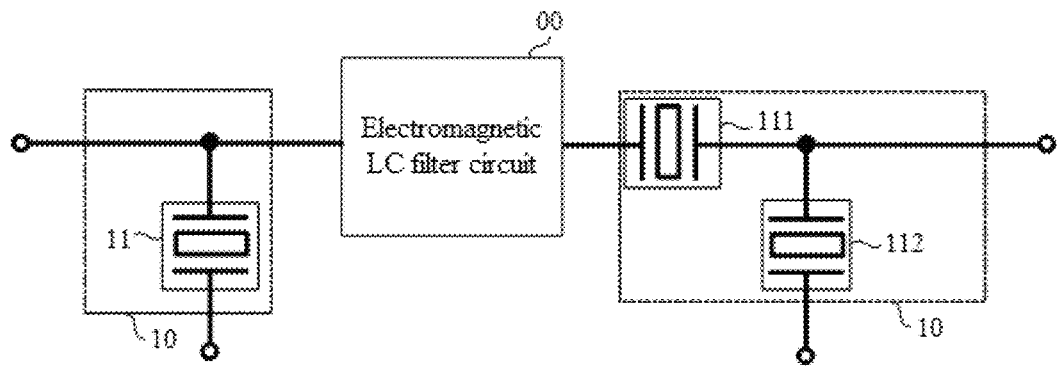
FIG. 3 is a schematic structural diagram of a band-pass filter circuit according to another embodiment of the present disclosure.

FIG. 3 is a schematic structural diagram of a band-pass filter circuit according to another embodiment of the present disclosure. Reference is made to FIG. 3. In an embodiment, the acoustic resonator 11 may be connected in parallel between a second terminal of the band-pass filter circuit and a second terminal of the electromagnetic LC filter circuit 00. In this case, the second terminal of the band-pass filter circuit serves as an input terminal of the band-pass filter circuit, and the second terminal of the electromagnetic LC filter circuit 00 serves as an input terminal of the electromagnetic LC filter circuit 00. The acoustic resonator 11 is connected in parallel on the input side of the electromagnetic LC filter circuit 00, so that a transmission zero can be formed within a left adjacent band. Thereby, a roll-off slope between a minimum frequency within the passband of the electromagnetic LC filter circuit 00 and the left adjacent band (a frequency in the left adjacent band is less than a frequency in the passband) is increased, an output amplitude of a noise signal within the left adjacent band is reduced, and a suppression effect of the adjacent band of the band-pass filter circuit is improved.

In an embodiment, the acoustic resonator 11 may be connected in parallel between the second terminal of the band-pass filter circuit and the second terminal of the electromagnetic LC filter circuit 00. Here, the second terminal of the band-pass filter circuit serves as the output terminal of the band-pass filter circuit, and the second terminal of the electromagnetic LC filter circuit 00 serves as the output terminal of the electromagnetic LC filter circuit 00. In this case, the roll-off slope of the passband of the electromagnetic LC filter circuit 00 is increased, and the suppression effect of the adjacent band of the band-pass filter circuit is improved.

In a further embodiment, there are multiple acoustic resonance units 10 each including one acoustic resonator 11. Some of the multiple acoustic resonance units 10 are connected on the input side of the electromagnetic LC filter circuit 00, and the other of the multiple acoustic resonance units 10 are connected on the output side of the electromagnetic LC filter circuit 00. The above-mentioned effects can also be achieved in this embodiment and are not repeated here.

In a case that the acoustic resonator 11 is connected in parallel between the second terminal of the band-pass filter circuit and the second terminal of the electromagnetic LC filter circuit 00, a terminal of the acoustic resonator 11 is not connected to the band-pass filter circuit, and may be connected to another circuit or ground. For example, the terminal of the acoustic resonator 11 not connected to the band-pass filter circuit may be connected to at least one of a capacitor, an inductor, or the like.

Figure 4:
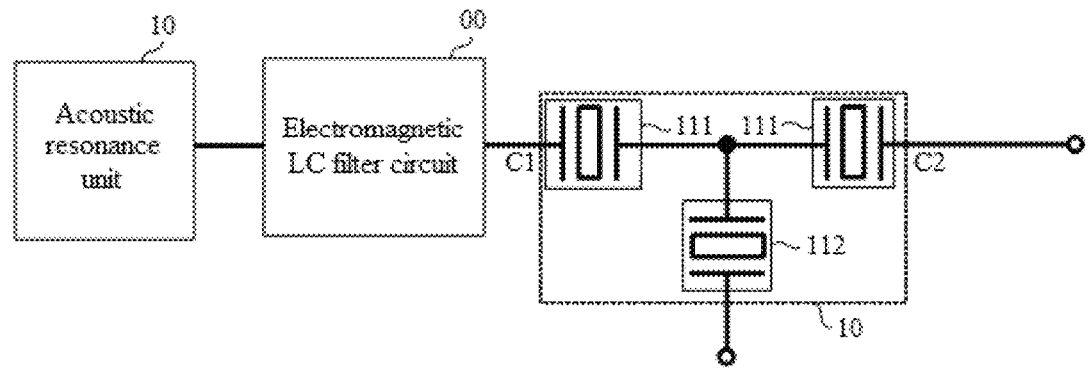
FIG. 4 is a schematic structural diagram of a band-pass filter circuit according to another embodiment of the present disclosure.

FIG. 4 is a schematic structural diagram of a band-pass filter circuit according to another embodiment of the present disclosure. Reference is made to FIG. 4. At least one acoustic resonance unit 10 each includes one first port C1, one second port C2, and three acoustic resonators 11. The three acoustic resonators 11 consist of two first acoustic resonators 111 and one second acoustic resonator 112. The two first acoustic resonators 111 are connected in series between the first port C1 and the second port C2. The second acoustic resonator 112 is connected to a terminal of each of the two first acoustic resonators 111. The at least one acoustic resonance unit 10 is connected in series between a first terminal of the band-pass filter circuit and a first terminal of the electromagnetic LC filter circuit 00. The first terminal of the band-pass filter circuit serves as an input terminal of the band-pass filter circuit, and the first terminal of the electromagnetic LC filter circuit 00 serves as an input terminal of the electromagnetic LC filter circuit 00. Alternatively, the first terminal of the band-pass filter circuit serves as an output terminal of the band-pass filter circuit, and the first terminal of the electromagnetic LC filter circuit 00 serves as an output terminal of the electromagnetic LC filter circuit 00.

FIG. 4 exemplarily shows that the acoustic resonance unit 10 includes the first port C1, the second port C2 and the three acoustic resonators 11. The three acoustic resonators 11 are connected in a T-shaped pattern. The two first acoustic resonators 111 are connected in series between the first terminal of the band-pass filter circuit and the first terminal of the electromagnetic LC filter circuit 00. A series resonant frequency of each of the first acoustic resonators 111 is within in the passband, and a transmission zero may be formed in a right adjacent band of the passband. Hence, a roll-off slope on the right side of the passband of the band-pass filter circuit is increased, and a suppression effect of the adjacent band of the band-pass filter circuit is improved. In addition, the second acoustic resonator 112 is connected to a terminal of each of the first acoustic resonators 111. A series resonant frequency of the second acoustic resonator 112 is set out of the passband of the band-pass filter circuit, or a parallel resonant frequency of the second acoustic resonator 112 is set within the passband of the band-pass filter circuit. Therefore, a signal within the passband is prevented from being outputted from the second acoustic resonator 112 to another circuit or the ground. Hence, a signal loss of the band-pass filter circuit is reduced, a transmission zero can be formed within a left adjacent band of the passband, and the suppression effect of the adjacent band of the band-pass filter circuit is improved. A terminal of the second acoustic resonator 112 is not connected to the first acoustic resonator 111, and may be connected to the ground or another circuit. Thereby, a noise signal within the adjacent band can be outputted from the second acoustic resonator 112 to another circuit or the ground. Hence, the noise signal within the adjacent band in the band-pass filter circuit is effectively suppressed, and a filtering effect of the band-pass filter circuit is improved.

FIG. 4 exemplarily shows that the acoustic resonance unit 10 is connected in series between the first terminal of the band-pass filter circuit and the first terminal of the electromagnetic LC filter circuit 00. Here, the first terminal of the band-pass filter circuit serves as an output terminal of the band-pass filter circuit, and the first terminal of the electromagnetic LC filter circuit 00 serves as an output terminal of the electromagnetic LC filter circuit 00. In another embodiment, the acoustic resonance unit 10 may be connected in series between the first terminal of the band-pass filter circuit and the first terminal of the electromagnetic LC filter circuit 00. Here, the first terminal of the band-pass filter circuit serves as an input terminal of the band-pass filter circuit, and the first terminal of the electromagnetic LC filter circuit 00 serves as an input terminal of the electromagnetic LC filter circuit 00.

In addition, the terminal of the second acoustic resonator 112 not connected to the first acoustic resonator 111 may be connected to a ground or another circuit. For example, the terminal of the acoustic resonator 11 not connected to the first acoustic resonator 111 may be connected to at least one of a capacitor or an inductor. An overall resonant frequency of the second acoustic resonator 112 and other circuits may be adjusted so that the series resonant frequency of a branch where the second acoustic resonator 112 is located is out of the passband of the band-pass filter circuit, or the parallel resonant frequency of the branch where the second acoustic resonator 112 is located is within the passband of the band-pass filter circuit. Hence, the signal whose frequency is within the passband can be prevented from being outputted from the second acoustic resonator 112 to another circuit, and thereby a loss of the band-pass filter circuit is reduced.

Figure 5:
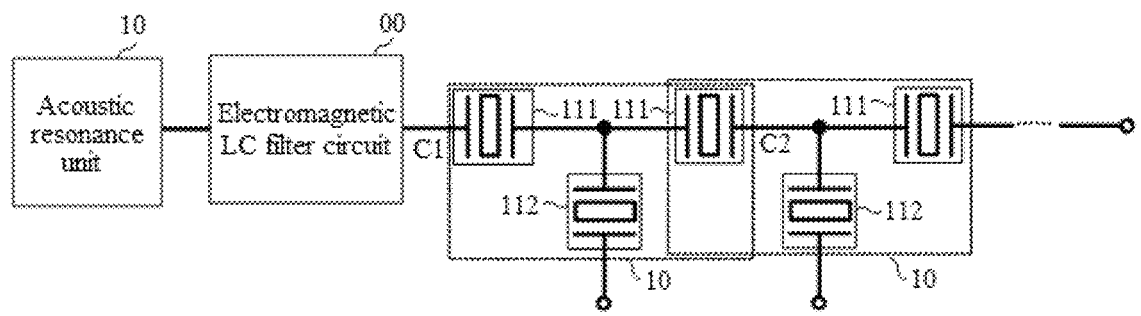
FIG. 5 is a schematic structural diagram of a band-pass filter circuit according to another embodiment of the present disclosure.

FIG. 5 is a schematic structural diagram of a band-pass filter circuit according to another embodiment of the present disclosure. Reference is made to FIG. 5. Multiple acoustic resonance units 10 are connected on one side of the electromagnetic LC filter circuit 00. Each of the acoustic resonance units 10 includes three acoustic resonators 11. The acoustic resonance units 10 may be connected in series to each other, and adjacent ones of the acoustic resonance units 10 may share one first acoustic resonator 111, so as to form multiple T-shaped connections. With the multiple acoustic resonance units 10, a filtering effect of the acoustic resonance units 10 can be further improved. In addition, each acoustic resonance unit 10 includes multiple transmission zeros within an adjacent frequency band. In a case that the band-pass filter circuit has multiple acoustic resonance units 10, the band-pass filter circuit has more transmission zeros within the adjacent frequency band. Therefore, the output amplitude of a noise signal within the adjacent frequency band can be further reduced, and the suppression effect of the adjacent band of the band-pass filter circuit is improved.

In a case that at least one acoustic resonance unit 10 each includes an acoustic resonator 11, the at least one acoustic resonance unit 10 may be disposed on one of the input side and the output side of the electromagnetic LC filter circuit 00, and the acoustic resonance units 10 each including three acoustic resonators 11 may be disposed on the other one of the input side and the output side of the electromagnetic LC filter circuit 00, which is not repeated here.

Figure 6:
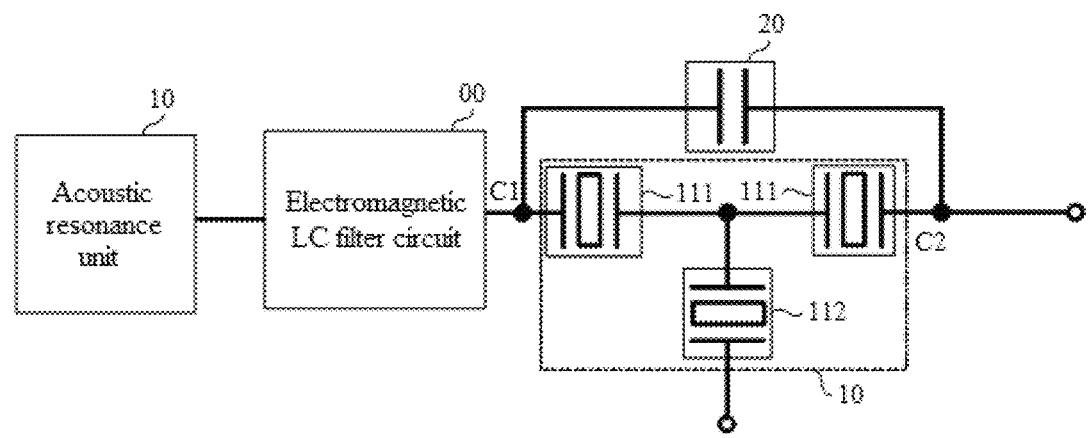
FIG. 6 is a schematic structural diagram of a band-pass filter circuit according to another embodiment of the present disclosure.

FIG. 6 is a schematic structural diagram of a band-pass filter circuit according to another embodiment of the present disclosure. As shown in FIG. 6, the band-pass filter circuit further includes at least one first circuit element 20. For each first circuit element, a first terminal of the first circuit element 20 is connected to a first port C1 of an acoustic resonance unit, and a second terminal of the first circuit element 20 is connected to a second port C2 of the acoustic resonance unit. Alternatively or additionally, the at least one first circuit element 20 is connected in series between the first terminal of the band-pass filter circuit and the first terminal of the electromagnetic LC filter circuit 00.

The first circuit element 20 includes an inductor or a capacitor. FIG. 6 exemplarily shows that the first circuit element 20 is a capacitor. The first circuit element 20 is connected between the first port C1 and the second port C2, that is, the capacitor is connected to two first acoustic resonators 111 in parallel. A resonant frequency of the first acoustic resonators 111 can be controlled through the capacitor so that a resonant frequency of the parallel structure formed by the capacitor and the first acoustic resonators 111 is out of the passband of the band-pass filter circuit. Hence, a noise signal out of the passband of the band-pass filter circuit is suppressed, and a filtering effect of the band-pass filter circuit is improved.

In an embodiment, the first circuit element 20 is an inductor. The first circuit element 20 may be connected in series between the first terminal of the band-pass filter circuit and the first terminal of the electromagnetic LC filter circuit 00. Thereby, the filtering function of the band-pass filter circuit is realized.

Figure 7:
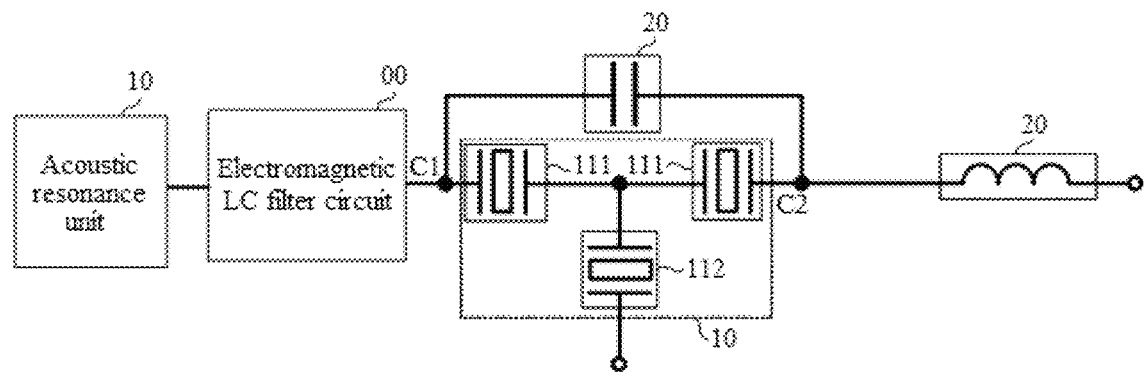
FIG. 7 is a schematic structural diagram of a band-pass filter circuit according to another embodiment of the present disclosure.

In an embodiment, multiple first circuit elements 20 are included. Reference is made to FIG. 7, which is a schematic structural diagram of a band-pass filter circuit according to another embodiment of the present disclosure. FIG. 7 exemplarily shows that two first circuit elements 20 are included. One of the first circuit elements 20 is a capacitor. The capacitor is connected in parallel between a first port C1 and a second port C2. The other one of the first circuit elements 20 is an inductor. The inductor is connected in series between the first terminal of the band-pass filter circuit and the first terminal of the electromagnetic LC filter circuit 00. The multiple first circuit elements 20 are disposed, so that the filtering function of the band-pass filter can be further improved.

Figure 8:
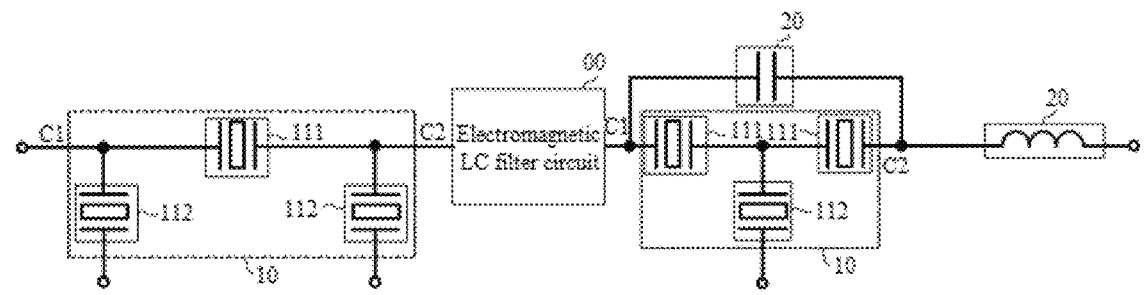
FIG. 8 is a schematic structural diagram of a band-pass filter circuit according to another embodiment of the present disclosure.

FIG. 8 is a schematic structural diagram of a band-pass filter circuit according to another embodiment of the present disclosure. Reference is made to FIG. 8. At least one acoustic resonance unit 10 each includes one first port C1, one second port C2, and at least three acoustic resonators 11. The at least three acoustic resonators 11 consist of at least one first acoustic resonator 111 and at least two second acoustic resonators 112. The first acoustic resonator 111 is connected in series between the first port C1 and the second port C2. The second acoustic resonators 112 are connected to a terminal of the first acoustic resonator 111. The acoustic resonance unit 10 is connected in series between the second terminal of the band-pass filter circuit and the second terminal of the electromagnetic LC filter circuit 00. The first terminal of the band-pass filter circuit serves as an output terminal of the band-pass filter circuit, and the first terminal of the electromagnetic LC filter circuit 00 serves as an output terminal of the electromagnetic LC filter circuit 00, the second terminal of the band-pass filter circuit serves as an input terminal of the band-pass filter circuit, and the second terminal of the electromagnetic LC filter circuit 00 serves as an input terminal of the electromagnetic LC filter circuit 00. Alternatively, the first terminal of the band-pass filter circuit serves as an input terminal of the band-pass filter circuit, the first terminal of the electromagnetic LC filter circuit 00 serves as an input terminal of the electromagnetic LC filter circuit 00, the second terminal of the band-pass filter circuit serves as an output terminal of the band-pass filter circuit, and the second terminal of the electromagnetic LC filter circuit 00 serves as an output terminal of the electromagnetic LC filter circuit 00.

FIG. 8 exemplarily shows that the acoustic resonator unit 10 includes three acoustic resonators 11. The three acoustic resonators 11 are connected in a π-shaped pattern. The first acoustic resonator 111 is connected in series between the second terminal of the band-pass filter circuit and the second terminal of the electromagnetic LC filter circuit 00. A series resonant frequency of the first acoustic resonator 111 is within the passband, and a transmission zero can be formed in an adjacent band of the passband. A roll-off slope on both sides of the passband of the band-pass filter circuit is increased, and the suppression effect of an adjacent band of the band-pass filter circuit is improved. In addition, one of the second acoustic resonators 112 is connected to a terminal of the first acoustic resonator 111, and the other one of the second acoustic resonators 112 is connected to another terminal of the first acoustic resonator 111. Hence, a transmission zero can be formed in the left adjacent band of the passband, so that the suppression effect of the adjacent band of the band-pass filter circuit is further improved. For each of the second acoustic resonators 112, a terminal of the second acoustic resonator 112 is not connected to the first acoustic resonator 111, and may be connected to the ground or another circuit. A series resonant frequency of the second acoustic resonator 112 may be set out of the passband of the band-pass filter circuit, or a parallel resonant frequency of the second acoustic resonator 112 is set within the passband of the band-pass filter circuit. Hence, a signal in the passband is prevented from being outputted from the second acoustic resonator 112 to another circuit or the ground, and a signal loss of the band-pass filter circuit is reduced. In a case that the series resonant frequency of the second acoustic resonator 112 is out of the passband of the band-pass filter circuit, for example, the series resonant frequency of the second acoustic resonator 112 may be within the adjacent band. Thereby, a noise signal within the adjacent band can be prevented from being outputted from the second acoustic resonator 112 to another circuit or the ground. Hence, the noise signal within the adjacent band in the band-pass filter circuit is effectively suppressed, and a filtering effect of the band-pass filter circuit is improved.

FIG. 8 exemplarily shows that the acoustic resonance unit 10 is connected in series between the second terminal of the band-pass filter circuit and the second terminal of the electromagnetic LC filter circuit 00. here, the second terminal of the band-pass filter circuit serves as an output terminal of the band-pass filter circuit, the second terminal of the electromagnetic LC filter circuit 00 serves as an output terminal of the electromagnetic LC filter circuit 00. In another embodiment, the acoustic resonance unit 10 may be connected in series between the second terminal of the band-pass filter circuit and the second terminal of the electromagnetic LC filter circuit 00. Here, the second terminal of the band-pass filter circuit serves as an input terminal of the band-pass filter circuit, and the second terminal of the electromagnetic LC filter circuit 00 serves as input terminal of the electromagnetic LC filter circuit 00.

In addition, the terminal of the second acoustic resonator 112 not connected to the first acoustic resonator 11 may be connected to a ground terminal or another circuit. For example, the terminal of the acoustic resonator 11 not connected to the first acoustic resonator 111 may be connected to at least one of a capacitor or an inductor. An overall resonant frequency of the second acoustic resonator 112 and other circuits may be adjusted so that the series resonant frequency of a branch where the second acoustic resonator 112 is located is out of the passband of the band-pass filter circuit, or the parallel resonant frequency of the branch where the second acoustic resonator 112 is located is within the passband of the band-pass filter circuit. Hence, the signal whose frequency is within the passband can be prevented from being outputted from the second acoustic resonator 112 to another circuit, and thereby a loss of the band-pass filter circuit is reduced.

Figure 9:
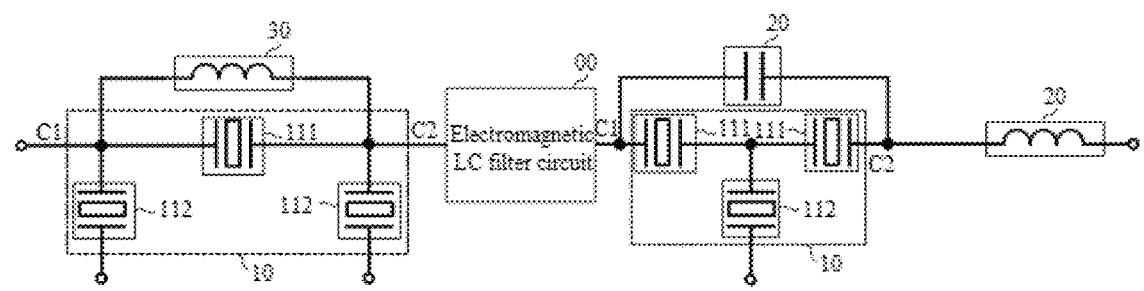
FIG. 9 is a schematic structural diagram of a band-pass filter circuit according to another embodiment of the present disclosure.

FIG. 9 is a schematic structural diagram of a band-pass filter circuit according to another embodiment of the present disclosure. As shown in FIG. 9, at least one acoustic resonance unit 10 each further includes a second circuit element 30. The second circuit element 30 is connected in series between a first port C1 and a second port C2. The second circuit element 30 includes an inductor or a capacitor.

The second circuit element 30 is connected in series between the first port C1 and the second port C2 of an acoustic resonator unit 10. Hence, the second circuit element 30 is connected with at least one first acoustic resonator 111 in parallel. The second circuit element 30 includes an inductor or a capacitor. A passband of the band-pass filter circuit may be adjusted by adjusting an electrical parameter of a parallel structure of the second circuit element 30 and the first acoustic resonator 111. By adjusting the electrical parameter of an integral structure of the first acoustic resonator 111 and the second circuit element 30, a position of the transmission zero of the acoustic resonance unit can be optimized, an output amplitude of a noise signal within an adjacent frequency band can be reduced, and a suppression effect of the adjacent frequency band of the band-pass filter circuit is improved.

Figure 10:
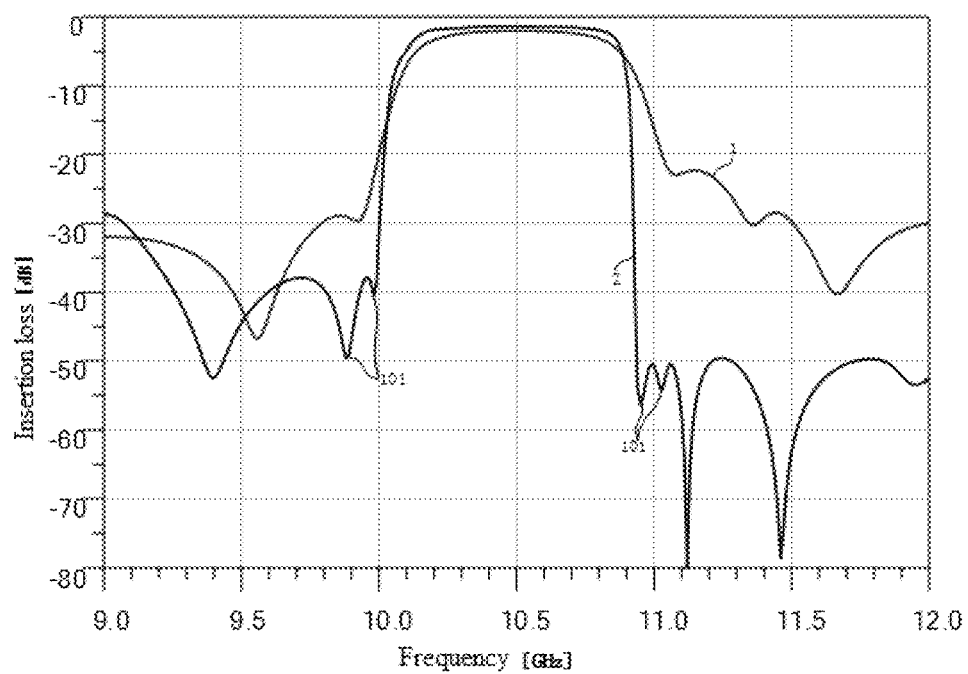
FIG. 10 is a schematic diagram showing a performance of a band-pass filter circuit as shown in FIG. 9.

FIG. 10 is a schematic diagram showing a performance of a band-pass filter circuit as shown in FIG. 9. In FIG. 10, an abscissa represents a frequency, and an ordinate is the insertion loss. Curve 1 shows a frequency of the electromagnetic LC filter circuit vs. an insertion loss of the electromagnetic LC filter circuit. Curve 2 shows a frequency of a band-pass filter circuit as shown in Figure vs. an insertion loss of the band-pass filter circuit as shown in FIG. 9. Reference is made to FIG. 10. The curve 2 indicates a passband much greater than 200 MHz. A roll-off slope of a frequency attenuation region of curve 2 is greater than a roll-off slope of a frequency attenuation region of curve 1. As can be seen, the band-pass filter circuit in the present disclosure has both a wide passband and a steep roll-off slope, so that the filtering effect of the band-pass filter circuit is improved. In addition, a first acoustic resonator 111 is connected to an inductor in parallel, and the first acoustic resonator 111 and the inductor are connected in series to the input side of the electromagnetic LC filter circuit 00. A first acoustic resonator 111 is connected to a capacitor in parallel, and the first acoustic resonator 111 and the capacitor are connected in series to an output side of the electromagnetic LC filter circuit 00. Multiple second acoustic resonators 112 are connected in parallel to the input side and the output side of the electromagnetic LC filter circuit 00. Therefore, transmission zeroes 101 are formed within an adjacent band on either side of the passband of the band-pass filter circuit. Hence, the output amplitude of a noise signal within the adjacent band is reduced, the suppression effect of the adjacent band of the band pass filter circuit is improved, and the filtering effect of the band-pass filter circuit is effectively improved. In a case that a parallel resonator frequency of the second acoustic resonator 112 is within the passband, the second acoustic resonator 112 can block a signal whose frequency is within the passband. Hence, an attenuation of the signal whose frequency is within the passband is reduced and the filtering effect of the band-pass filter circuit is improved. Reference is further made to FIG. 10. Compared with curve 1, the adjacent band shown by curve 2 is a wideband, that is, a bandwidth of curve 2 for frequency suppression of the adjacent band is greater than 200 MHz. Hence, a wideband suppression of the adjacent band is realized and the filtering effect of the band-pass filter circuit is improve.

Based on the above technical solutions, in a case that at least two acoustic resonance units 10 are connected between the second terminal of the band-pass filter circuit and the second terminal of the electromagnetic LC filter circuit 00, adjacent ones of the acoustic resonance units 10 share one second acoustic resonator 11.

In a case that multiple acoustic resonance units 10 are disposed on one side of the electromagnetic LC filter circuit 00 and each of the acoustic resonance units 10 includes three acoustic resonators 11, the acoustic resonance units 10 may be connected in series, and adjacent ones of the acoustic resonance units 10 may share one second acoustic resonator 11, so as to form multiple π-shaped connections. The multiple acoustic resonance units 10 are disposed, so that the filtering effect of the acoustic resonance units 10 is further improved. In addition, each of the acoustic resonance units 10 includes transmission zeros in multiple adjacent bands. With the multiple acoustic resonance units 10, the band-pass filter circuit has more transmission zeros in adjacent bands. Hence, an output amplitude of a noise signal within an adjacent band is further reduced, and the suppression effect of the adjacent band of the band-pass filter circuit is improved.

Figure 11:
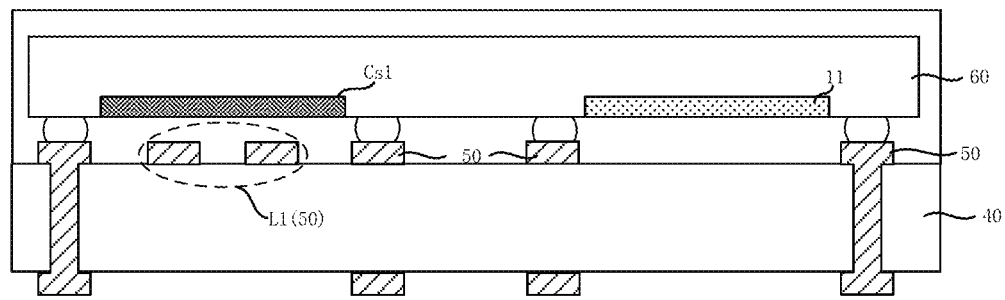
FIG. 11 is a schematic structural diagram of a band-pass filter circuit according to another embodiment of the present disclosure.

FIG. 11 is a schematic structural diagram of a band-pass filter circuit according to another embodiment of the present disclosure. As shown in FIG. 11, the band-pass filter circuit further includes a substrate 40 and at least one chip 60. The electromagnetic LC filter circuit 00 includes at least one inductor L1 and at least one capacitor Cs1. The at least one chip 60 is disposed on one side of the substrate 40. Both the least one acoustic resonator 11 and the at least one capacitor Cs1 are disposed on the chip 60. The at least one inductor L1 is disposed in the substrate 40.

A conductive layer 50 is disposed within the substrate 40, for forming the inductor L1. In a case that the conductive layer 50 includes multiple layers, the inductor L1 may be of a three-dimensional inductor structure. Hence, an area for the inductor L1 may be reduced while ensuring an inductance of the inductor L1 and a quality factor of the inductor, which is beneficial to reducing an area occupied by the band-pass filter circuit. The acoustic resonator 11 may be at least one of the first acoustic resonator 111 or the second acoustic resonator 112. The acoustic resonator 11 may be integrated on the chip 60 through a chip integration process, so as to ensure a performance of the acoustic resonator 11. An electrical connection between the acoustic resonator 11 on the chip 60 and the inductor L1 in the substrate 40 may be realized through a solder ball, a copper pillar, metal bonding, and other methods.

The capacitor Cs1 is disposed on the chip 60, so that the capacitor Cs1 has a high quality factor and consistency, which is beneficial to improving the filtering performance of the band-pass filter circuit. The consistency refers to that capacitors Cs1 from different batches are the same or slightly different in terms of an electrical performance, or capacitors Cs1 at different positions on a same wafer are the same or slightly different in terms of the electrical performance. A relatively large capacitance may be generated with a relatively small occupied space. An occupied space of the capacitor Cs1 is reduced while ensuring the quality factor of the capacitor Cs1, which is beneficial to reducing an occupied space of the band-pass filter circuit. FIG. 11 exemplarily shows that the capacitor Cs1 and the acoustic resonator 11 are disposed on a same chip 60.

Figure 12:
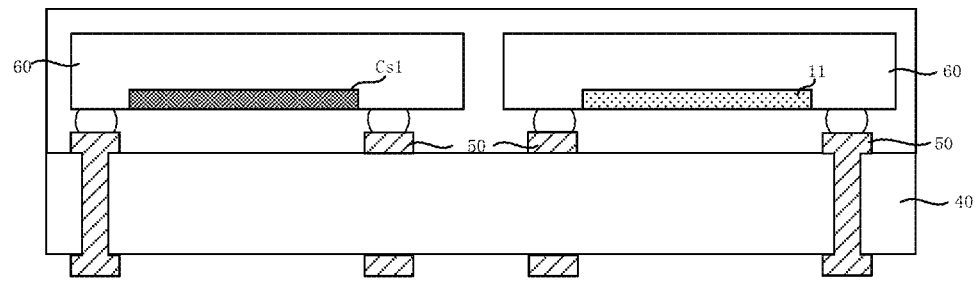
FIG. 12 is a schematic structural diagram of a band-pass filter circuit according to another embodiment of the present disclosure.

FIG. 12 is a schematic structural diagram of a band-pass filter circuit according to another embodiment of the present disclosure. As shown in FIG. 12, the band-pass filter circuit further includes a substrate 40 and at least two chips 60. The electromagnetic LC filter circuit 00 includes at least one of an inductor L1 or a capacitor Cs1. The at least two chips 60 are arranged on one side of the substrate 40. At least one acoustic resonator 11 is disposed on one of the chips 60. The at least one of the capacitor Cs1 or the inductor L1 is disposed on one of the chips 60 other than the chip disposed with the acoustic resonator 11.

FIG. 12 exemplarily shows that the electromagnetic LC filter circuit 00 includes two chips 60 and one capacitor Cs1. The acoustic resonator 11 is disposed on one of the chips 60. The capacitor Cs1 is disposed on the other of the chips 60. By forming different elements on different chips 60, a yield of the element can be better controlled. Hence, a yield of the band-pass filter circuit formed after the acoustic resonator 11 and the electromagnetic LC filter circuit 00 are connected to each other is improved, which is beneficial to reducing a cost of the band-pass filter circuit.

FIG. 12 exemplarily shows that only the capacitor Cs1 is disposed on the chip 60. In another embodiment, an inductor in the electromagnetic LC filter circuit may be disposed on the chip 60, so as to reduce provision of the inductor in the substrate 40.

Figure 13:
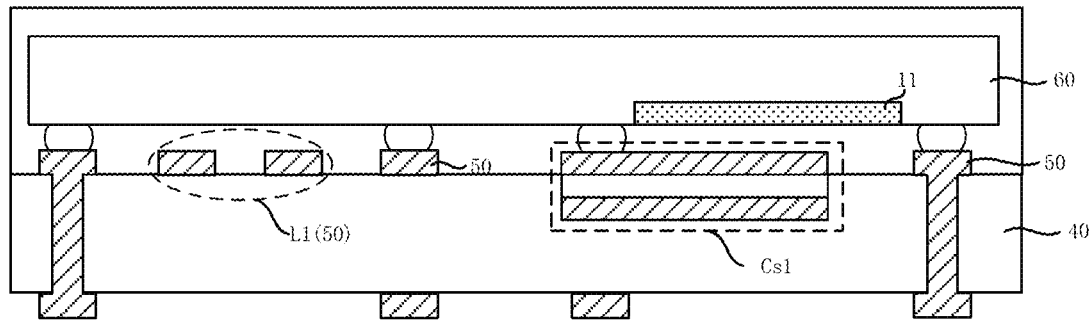
FIG. 13 is a schematic structural diagram of a band-pass filter circuit according to another embodiment of the present disclosure.

FIG. 13 is a schematic structural diagram of a band-pass filter circuit according to another embodiment of the present disclosure. As shown in FIG. 13, the band-pass filter circuit further includes a substrate 40 and at least one chip 60, and the electromagnetic LC filter circuit 00 includes at least one of an inductor L1 or a capacitor Cs1. The at least one chip 60 is disposed on one side of the substrate 40. At least one acoustic resonator 11 is disposed on the chip 60, and the at least one of a capacitor Cs1 or an inductor L1 is disposed in the substrate 40.

FIG. 13 exemplarily shows that the band-pass filter circuit includes one chip 60, and the electromagnetic LC filter circuit 00 includes one inductor L1 and one capacitor Cs1. The acoustic resonator 11 may be at least one of a first acoustic resonator 111 or a second acoustic resonator 112. The acoustic resonator 11 is disposed on the chip 60, so as to ensure a performance of the acoustic resonator 11. A multi-layer conductive layer 50 may be included in the substrate 40, and dielectric layers are filled between layers of the conductive layer 50. In a case that the inductor L1 and the capacitor Cs1 are disposed in the substrate 40, the inductor L1 may be formed in a three-dimensional structure through the multi-layer conductive layer 50. Hence, an area for the inductor L1 may be reduced, while ensuring an inductance of the inductor L1 and a quality factor of the inductor, which is beneficial to reducing an occupied area of the band-pass filter circuit. In addition, multiple capacitors Cs1 may be connected to each other in series or in parallel.

Figure 14:
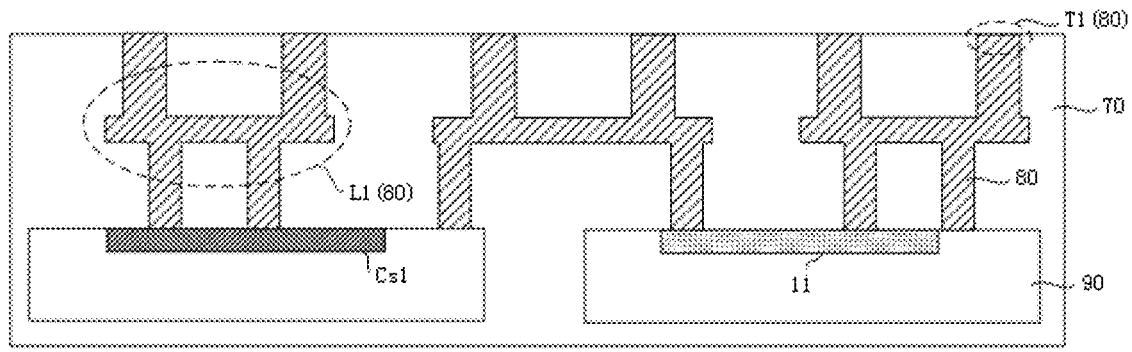
FIG. 14 is a schematic structural diagram of a band-pass filter circuit according to another embodiment of the present disclosure.

FIG. 14 is a schematic structural diagram of a band-pass filter circuit according to another embodiment of the present disclosure. As shown in FIG. 14, the band-pass filter circuit further includes an encapsulation layer 70, a conductive layer 80, and at least two chips 90. The electromagnetic LC filter circuit 00 includes at least one inductor L1 and at least one capacitor Cs1. The conductive layer 80 is formed as at least one inductor L1 and a connector T1. At least one acoustic resonator 11 is disposed on the chip 90. The at least one capacitor Cs1 is disposed on another chip 90. The encapsulation layer 70 covers the chips 90 and the conductive layer 80, and exposes the connector T1.

The conductive layer 80 may form an inductor L1. In a case that the conductive layer 80 includes multiple layers, the inductor L1 may be of a three-dimensional structure. Hence, an area for the inductor L1 may be reduced while ensuring an inductance of the inductor L1 and a quality factor of the inductor, which is beneficial to reducing an occupied area of the band-pass filter circuit. The encapsulation layer 70 covers the conductive layer 80, so that the inductor L1 is embedded within the encapsulation layer 70. Therefore, a high quality factor of the inductor L1 is ensured. FIG. 14 exemplarily shows that the band-pass filter circuit includes two chips 90. One of the chips 90 is disposed with the acoustic resonator 11, so as to ensure a performance of the acoustic resonator 11. The other one of the chips 90 is disposed with the capacitor Cs1, so that the capacitor Cs1 has a high quality factor and better consistency, which is beneficial to improving a filtering performance of the band-pass filter circuit. A relatively large capacitance may be generated with a relatively small occupied space. An occupied space of the capacitor Cs1 is reduced while ensuring the quality factor of the capacitor Cs1, which is beneficial to reducing an occupied space of the band-pass filter circuit. The encapsulation layer 70 covers the chips 90 and the conductive layer 80, so that the band-pass filter circuit has an integrated encapsulation layer 70. The connector T1 is exposed, forming a fan-out packaging. Thereby, an integration and reliability of modules of the band-pass filter circuit is improved.

Figure 15:
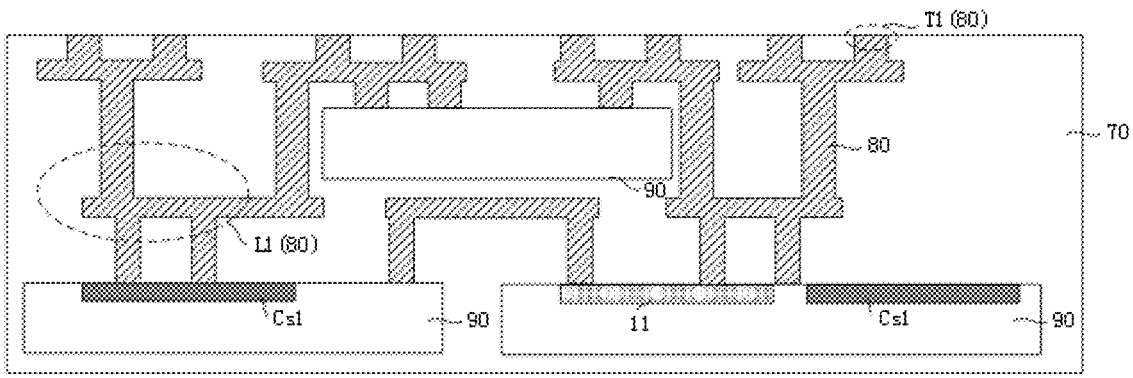
FIG. 15 is a schematic structural diagram of a band-pass filter circuit according to another embodiment of the present disclosure.

In another embodiment, the capacitor Cs1 and the acoustic resonator 11 may be disposed on a same chip 90. FIG. 15 is a schematic structural diagram of a band-pass filter circuit according to another embodiment of the present disclosure. As shown in FIG. 15, the electromagnetic LC filter circuit 00 includes two capacitors Cs1. One capacitor Cs1 is independently disposed on a chip 90. The other capacitor Cs1 and the acoustic resonator 11 are both disposed on another chip 90. In addition, in a case that the electromagnetic LC filter circuit 00 includes multiple capacitors Cs1 and the band-pass filter circuit includes multiple acoustic resonators 11, the band-pass filter circuit may include multiple chips 90. For each of the chips 90, the chip may be disposed with merely an capacitor Cs1, forming a capacitor chip; or the chip may be disposed with merely an acoustic resonator 11, forming an acoustic resonator chip; or the chip may be disposed with both the capacitor Cs1 and the acoustic resonator 11, forming a hybrid chip, which depends on a requirement and is not limited here.

Figure 16:
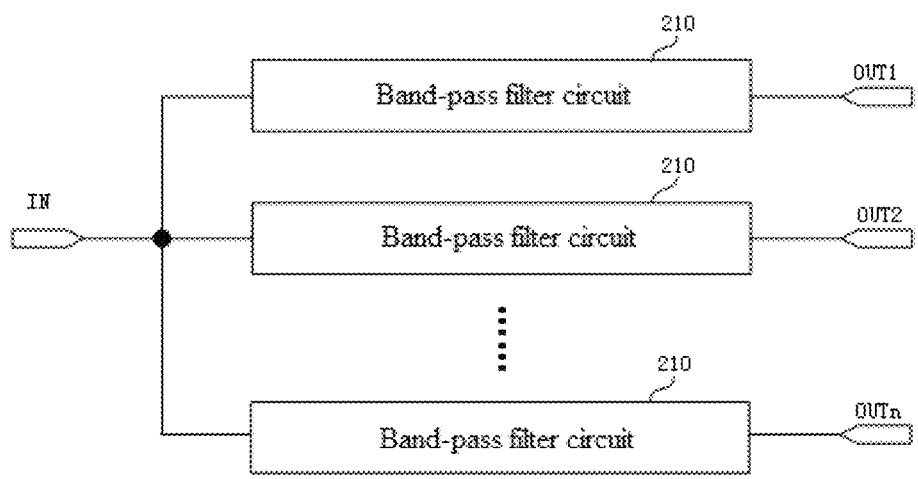
FIG. 16 is a schematic structural diagram of a multiplexer according to an embodiment of the present disclosure.

A multiplexer is further provided according to an embodiment of the present disclosure. FIG. 16 is a schematic structural diagram of a multiplexer according to an embodiment of the present disclosure. As shown in FIG. 16, the multiplexer includes a band-pass filter circuit 210 according to any of the embodiments of the present disclosure.

Reference is further made to FIG. 16. The multiplexer includes a first terminal IN and at least two second terminals. Each band-pass filter circuit 210 is connected in series between the first terminal IN and one of the second terminals of the multiplexer.

FIG. 16 exemplarily shows that the multiplexer includes one first terminal IN and n second terminals. The second terminals are noted as OUT1, OUT2 . . . OUTn, respectively. Each band-pass filter circuit 210 is connected in series between the first terminal IN and one of the second terminals. For example, a first band-pass filter circuit 210 is connected in series between the first terminal IN and a first one of the second terminal, OUT1; a second band-pass filter circuit 210 is connected in series between the first terminal IN and a second one of the second terminals, OUT2; and the like. The multiplexer includes the band-pass filter circuit 210 according to any one of the embodiments of the present disclosure, and therefore has the effect of the band-pass filter circuit. The multiplexer has a high roll-off slope, so that a suppression of a steep transition band can be realized. In addition, the suppression effect of an adjacent band of the band-pass filter circuit can be improved, so that a wideband suppression of the adjacent band is realized. Hence, the filtering effect of the band-pass filter circuit is improved.

It should be noted that the multiplexer may further include a filter circuit other than the band-pass filter circuit described above. The filter circuit is connected in series between the first terminal IN and any one of the second terminals. The filter circuit may be a low-pass filter circuit, a high-pass filter circuit, or a band-pass filter circuits, which is not limited here.

The invention claimed is:

1. A band-pass filter circuit, comprising an electromagnetic LC filter circuit and acoustic resonance circuits, wherein
at least one first acoustic resonance circuit of the acoustic resonance circuits each comprises at least one first acoustic resonator and at least one second acoustic resonator;
the at least one first acoustic resonator is connected in series between a first terminal of the band-pass filter circuit and a first terminal of the electromagnetic LC filter circuit;
each of the at least one second acoustic resonator is connected to a terminal of the at least one first acoustic resonator, wherein the first terminal of the band-pass filter circuit serves as an input terminal or output terminal of the band-pass filter circuit;
one or more of the acoustic resonance circuits are connected on an input side of the electromagnetic LC filter circuit; and
the remaining one or more of the acoustic resonance circuits are connected on an output side of the electromagnetic LC filter circuit.

2. The band-pass filter circuit according to claim 1, wherein
each acoustic resonance circuit other than the at least one first acoustic resonance circuit comprises only one acoustic resonator; and
one or more acoustic resonators comprised in an acoustic resonance circuit other than the at least one first acoustic resonator circuit are all connected in series between a second terminal of the band-pass filter circuit and a second terminal of the electromagnetic LC filter circuit, or the one or more acoustic resonators comprised in an acoustic resonance circuit other than the at least one first acoustic resonator circuit are connected in parallel between the second terminal of the band-pass filter circuit and the second terminal of the electromagnetic LC filter circuit, wherein
the second terminal of the band-pass filter circuit serves as an input terminal of the band-pass filter circuit, and the second terminal of the electromagnetic LC filter circuit serves as an input terminal of the electromagnetic LC filter circuit, or
the second terminal of the band-pass filter circuit serves as an output terminal of the band-pass filter circuit, and the second terminal of the electromagnetic LC filter circuit serves as an output terminal of the electromagnetic LC filter circuit.

3. The band-pass filter circuit according to claim 1, wherein
the at least one first acoustic resonance circuit each comprises a first port, a second port, and three acoustic resonators;
the three acoustic resonators comprise two first acoustic resonators and one second acoustic resonator;
the two first acoustic resonators are connected in series between the first port and the second port,
the second acoustic resonator is connected to a terminal of the at least one first acoustic resonator; and
the at least one first acoustic resonance circuit is connected in series between the first terminal of the band-pass filter circuit and the first terminal of the electromagnetic LC filter circuit; wherein
the first terminal of the band-pass filter circuit serves as an input terminal of the band-pass filter circuit, and the first terminal of the electromagnetic LC filter circuit serves as an input terminal of the electromagnetic LC filter circuit; or
the first terminal of the band-pass filter circuit serves as an output terminal of the band-pass filter circuit, and the first terminal of the electromagnetic LC filter circuit serves as an output terminal of the electromagnetic LC filter circuit.

4. The band-pass filter circuit according to claim 3, further comprising one or both of:
at least one first circuit element, each of which comprises a first terminal connected to the first port of one of the at least one first acoustic resonance circuit, and a second terminal connected to the second port of the first acoustic resonance circuit; and
at least one first circuit element, connected in series between the first terminal of the band-pass filter circuit and the first terminal of the electromagnetic LC filter circuit.

5. The band-pass filter circuit according to claim 1, wherein
at least one second acoustic resonance circuit other than the at least one first acoustic resonance circuit each comprises one first port, one second port, and at least three acoustic resonators;
the at least three acoustic resonators comprise at least one first acoustic resonator and at least two second acoustic resonators;
the at least one first acoustic resonator is connected in series between the first port and the second port,
each of the at least two second acoustic resonators is connected to a terminal of the at least one first acoustic resonator; and
the at least one second acoustic resonance circuit is connected in series between the second terminal of the band-pass filter circuit and the second terminal of the electromagnetic LC filter circuit; wherein
the first terminal of the band-pass filter circuit serves as an output terminal of the band-pass filter circuit, the first terminal of the electromagnetic LC filter circuit serves as an output terminal of the electromagnetic LC filter circuit, the second terminal of the band-pass filter circuit serves as an input terminal of the band-pass filter circuit, and the second terminal of the electromagnetic LC filter circuit serves as an input terminal of the electromagnetic LC filter circuit; or
the first terminal of the band-pass filter circuit serves as an input terminal of the band-pass filter circuit, the first terminal of the electromagnetic LC filter circuit serves as an input terminal of the electromagnetic LC filter circuit, the second terminal of the band-pass filter circuit serves as an output terminal of the band-pass filter circuit, and the second terminal of the electromagnetic LC filter circuit serves as an output terminal of the electromagnetic LC filter circuit.

6. The band-pass filter circuit according to claim 5, wherein the at least one second acoustic resonance circuit other than the at least one first acoustic resonance circuit each further comprises a second circuit element, and the second circuit element is connected in parallel with the at least one first acoustic resonator of the at least one second acoustic resonance circuit, and is connected between the first port and the second port; wherein the second circuit element comprise an inductor or a capacitor.

7. The band-pass filter circuit according to claim 5, wherein a quantity of second acoustic resonance circuits connected between the second terminal of the band-pass filter circuit and the second terminal of the electromagnetic LC filter circuit is two or more, and adjacent ones of the second acoustic resonance circuits share one of the at least two second acoustic resonators.

8. The band-pass filter circuit according to claim 1, further comprising a substrate and one chip, wherein the electromagnetic LC filter circuit comprises at least one inductor and at least one capacitor;

the chip is disposed on a side of the substrate;

all acoustic resonators in the acoustic resonance circuits are disposed on the chip;

the at least one capacitor is disposed on the chip; and the at least one inductor is disposed in the substrate.

9. The band-pass filter circuit according to claim 1, further comprising a substrate and at least two chips, wherein the electromagnetic LC filter circuit comprises at least one inductor or at least one capacitor;

the at least two chips are disposed on a side of the substrate;

all acoustic resonators in the acoustic resonance circuits are disposed on one of the at least two chips, and the at least one inductor or the at least one capacitor is disposed on another of the at least two chips.

10. The band-pass filter circuit according to claim 1, further comprising a substrate and at least one chip, wherein the electromagnetic LC filter circuit comprises at least one inductor or at least one capacitor;

the at least one chip is disposed on a side of the substrate;

all acoustic resonators in the acoustic resonance circuits are disposed on the at least one chip, and the at least one inductor or the at least one capacitor is disposed in the substrate.

11. The band-pass filter circuit according to claim 1, further comprising an encapsulation layer, a conductive layer, and at least two chips, wherein the electromagnetic LC filter circuit comprises at least one inductor and at least one capacitor;

the at least one inductor and a connector is located in the conductive layer, all acoustic resonators in the acoustic resonance circuits are disposed on one of the at least two chips, the at least one capacitor is disposed on another of the at least two chips, and the encapsulation layer covers the at least two chips and the conductive layer, and exposes the connector.

12. A multiplexer, comprising a band-pass filter circuit, wherein the band-pass filter circuit comprises an electromagnetic LC filter circuit and acoustic resonance circuits;

at least one first acoustic resonance circuit of the acoustic resonance circuits each comprises at least one first acoustic resonator and at least one second acoustic resonator;

the at least one first acoustic resonator is connected in series between a first terminal of the band-pass filter circuit and a first terminal of the electromagnetic LC filter circuit;

each of the at least one second acoustic resonator is connected to a terminal of the at least one first acoustic resonator, wherein the first terminal of the band-pass filter circuit serves as an input terminal or output terminal of the band-pass filter circuit;

one or more of the acoustic resonance circuits are connected on an input side of the electromagnetic LC filter circuit; and the remaining one or more of the acoustic resonance circuits are connected on an output side of the electromagnetic LC filter circuit.

13. The multiplexer according to claim 12, wherein in the band-pass filter circuit, each acoustic resonance circuit other than the at least one first acoustic resonance circuit comprises only one acoustic resonator; and one or more acoustic resonators comprised in an acoustic resonance circuit other than the at least one first acoustic resonator circuit are all connected in series between a second terminal of the band-pass filter circuit and a second terminal of the electromagnetic LC filter circuit, or the one or more acoustic resonators comprised in an acoustic resonance circuit other than the at least one first acoustic resonator circuit are connected in parallel between the second terminal of the band-pass filter circuit and the second terminal of the electromagnetic LC filter circuit, wherein the second terminal of the band-pass filter circuit serves as an input terminal of the band-pass filter circuit, and the second terminal of the electromagnetic LC filter circuit serves as an input terminal of the electromagnetic LC filter circuit, or the second terminal of the band-pass filter circuit serves as an output terminal of the band-pass filter circuit, and the second terminal of the electromagnetic LC filter circuit serves as an output terminal of the electromagnetic LC filter circuit.

14. The multiplexer according to claim 12, wherein in the band-pass filter circuit, the at least one first acoustic resonance circuit each comprises a first port, a second port, and three acoustic resonators;

the three acoustic resonators comprise two first acoustic resonators and one second acoustic resonator;

the two first acoustic resonators are connected in series between the first port and the second port, the second acoustic resonator is connected to a terminal of the at least one first acoustic resonator; and the at least one first acoustic resonance circuit is connected in series between the first terminal of the band-pass filter circuit and the first terminal of the electromagnetic LC filter circuit; wherein the first terminal of the band-pass filter circuit serves as an input terminal of the band-pass filter circuit, and the first terminal of the electromagnetic LC filter circuit serves as an input terminal of the electromagnetic LC filter circuit; or the first terminal of the band-pass filter circuit serves as an output terminal of the band-pass filter circuit, and the first terminal of the electromagnetic LC filter circuit serves as an output terminal of the electromagnetic LC filter circuit.

15. The multiplexer according to claim 14, wherein the band-pass filter circuit further comprises one or both of:
- at least one first circuit element, each of which comprises a first terminal connected to the first port of one of the at least one first acoustic resonance circuit, and a second terminal connected to the second port of the first acoustic resonance circuit; and
- at least one first circuit element, connected in series between the first terminal of the band-pass filter circuit and the first terminal of the electromagnetic LC filter circuit.

16. The multiplexer according to claim 12, wherein in the band-pass filter circuit,
- at least one second acoustic resonance circuit other than the at least one first acoustic resonance circuit each comprises one first port, one second port, and at least three acoustic resonators;
- the at least three acoustic resonators comprise at least one first acoustic resonator and at least two second acoustic resonators;
- the at least one first acoustic resonator is connected in series between the first port and the second port,
- each of the at least two second acoustic resonators is connected to a terminal of the at least one first acoustic resonator; and
- the at least one second acoustic resonance circuit is connected in series between the second terminal of the band-pass filter circuit and the second terminal of the electromagnetic LC filter circuit; wherein
- the first terminal of the band-pass filter circuit serves as an output terminal of the band-pass filter circuit, the first terminal of the electromagnetic LC filter circuit serves as an output terminal of the electromagnetic LC filter circuit, the second terminal of the band-pass filter circuit serves as an input terminal of the band-pass filter circuit, and the second terminal of the electromagnetic LC filter circuit serves as an input terminal of the electromagnetic LC filter circuit; or
- the first terminal of the band-pass filter circuit serves as an input terminal of the band-pass filter circuit, the first terminal of the electromagnetic LC filter circuit serves as an input terminal of the electromagnetic LC filter circuit, the second terminal of the band-pass filter circuit serves as an output terminal of the band-pass filter circuit, and the second terminal of the electromagnetic LC filter circuit serves as an output terminal of the electromagnetic LC filter circuit.

17. The multiplexer according to claim 16, wherein in the band-pass filter circuit,
- the at least one second acoustic resonance circuit other than the at least one first acoustic resonance circuit each further comprises a second circuit element, and
- the second circuit element is connected in parallel with the at least one first acoustic resonator of the at least one second acoustic resonance circuit, and is connected between the first port and the second port; wherein
- the second circuit element comprise an inductor or a capacitor.

18. The multiplexer according to claim 16, wherein in the band-pass filter circuit,
- a quantity of second acoustic resonance circuits connected between the second terminal of the band-pass filter circuit and the second terminal of the electromagnetic LC filter circuit is two or more, and
- adjacent ones of the second acoustic resonance circuits share one of the at least two second acoustic resonators.

19. The multiplexer according to claim 12, wherein the band-pass filter circuit further comprises a substrate and at least one chip, and wherein
- the electromagnetic LC filter circuit comprises at least one inductor or at least one capacitor;
- the at least one chip is disposed on a side of the substrate;
- all acoustic resonators in the acoustic resonance circuits are disposed on the at least one chip, and
- the at least one inductor or the at least one capacitor is disposed in the substrate.

20. The multiplexer according to claim 12, wherein the band-pass filter circuit further comprises an encapsulation layer, a conductive layer, and at least two chips, and wherein
- the electromagnetic LC filter circuit comprises at least one inductor and at least one capacitor;
- the at least one inductor and a connector is located in the conductive layer,
- all acoustic resonators in the acoustic resonance circuits are disposed on one of the at least two chips,
- the at least one capacitor is disposed on another of the at least two chips, and
- the encapsulation layer covers the at least two chips and the conductive layer, and exposes the interface.

* * * * *